United States Patent
Sasaki et al.

(10) Patent No.: US 10,614,866 B2
(45) Date of Patent: Apr. 7, 2020

(54) MAGNETORESISTANCE EFFECT ELEMENT, MAGNETIC MEMORY, AND MAGNETIC DEVICE

(71) Applicant: TDK CORPORATION, Tokyo (JP)

(72) Inventors: Tomoyuki Sasaki, Tokyo (JP); Yohei Shiokawa, Tokyo (JP); Jiro Yoshinari, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/120,960

(22) Filed: Sep. 4, 2018

(65) Prior Publication Data

US 2019/0108865 A1    Apr. 11, 2019

(30) Foreign Application Priority Data

Sep. 4, 2017  (JP) ................................. 2017-169734
Aug. 27, 2018  (JP) ................................. 2018-158487

(51) Int. Cl.
| | |
|---|---|
| G11C 11/16 | (2006.01) |
| G11C 11/14 | (2006.01) |
| G01R 33/09 | (2006.01) |
| H01L 43/12 | (2006.01) |
| H01L 43/08 | (2006.01) |

(52) U.S. Cl.
CPC ............ *G11C 11/14* (2013.01); *G01R 33/093* (2013.01); *G01R 33/098* (2013.01); *G11C 11/161* (2013.01); *H01L 43/08* (2013.01); *H01L 43/12* (2013.01)

(58) Field of Classification Search
CPC .............................. G11C 11/16; G11C 11/1675
USPC ................................................... 365/158, 173
See application file for complete search history.

(56) References Cited

U.S. PATENT DOCUMENTS

| | | | | |
|---|---|---|---|---|
| 8,741,396 | B2* | 6/2014 | Ishikawa ............... | C23C 16/347 257/E21.24 |
| 8,796,814 | B2* | 8/2014 | Ogihara .................. | H01L 43/12 257/529 |
| 2006/0261425 | A1* | 11/2006 | Suemitsu ................ | H01L 43/08 257/421 |
| 2008/0164547 | A1* | 7/2008 | Higo ...................... | B82Y 10/00 257/421 |
| 2010/0176472 | A1* | 7/2010 | Shoji ...................... | B82Y 25/00 257/421 |
| 2011/0101431 | A1* | 5/2011 | Takeuchi .......... | H01L 21/76826 257/295 |
| 2012/0032288 | A1 | 2/2012 | Tomioka | |
| 2012/0032289 | A1* | 2/2012 | Ohmori ................. | H01L 27/228 257/427 |
| 2012/0156522 | A1* | 6/2012 | Maat ...................... | B82Y 10/00 428/811.2 |

(Continued)

FOREIGN PATENT DOCUMENTS

JP         2012-038815 A     2/2012

*Primary Examiner* — Michael T Tran
(74) *Attorney, Agent, or Firm* — Oliff PLC (57) ABSTRACT

A magnetoresistance effect element has a structure in which a first ferromagnetic layer, a non-magnetic layer, and a second ferromagnetic layer are subsequently laminated and outer circumferential portions of the first ferromagnetic layer, the non-magnetic layer, and the second ferromagnetic layer are covered with a first insulating film which contains silicon nitride as a main component and contains further boron nitride or aluminum nitride.

14 Claims, 4 Drawing Sheets

(56) References Cited

U.S. PATENT DOCUMENTS

| | | | |
|---|---|---|---|
| 2012/0199895 A1* | 8/2012 | Nitta | G11C 11/14 257/295 |
| 2013/0033931 A1* | 2/2013 | Yamane | G11C 11/161 365/171 |
| 2013/0234268 A1* | 9/2013 | Kariyada | H01L 43/08 257/421 |
| 2013/0250670 A1* | 9/2013 | Nakai | G11C 11/161 365/158 |
| 2014/0138347 A1* | 5/2014 | Toyosato | H01L 43/12 216/22 |
| 2015/0255135 A1* | 9/2015 | Tran | G11C 11/161 365/158 |
| 2015/0280111 A1* | 10/2015 | Yuasa | H01L 43/08 257/421 |
| 2016/0013397 A1* | 1/2016 | Kitagawa | H01L 43/08 257/421 |
| 2016/0372657 A1* | 12/2016 | Nakata | B81B 7/02 |
| 2017/0194378 A1* | 7/2017 | Kim | G06F 12/084 |
| 2017/0222138 A1* | 8/2017 | Park | H01L 21/3065 |
| 2017/0294375 A1* | 10/2017 | Terada | H01L 27/2409 |
| 2019/0172513 A1* | 6/2019 | Kariyada | H01L 43/08 |
| 2019/0288185 A1* | 9/2019 | Shiokawa | H01L 43/08 |
| 2019/0333560 A1* | 10/2019 | Sasaki | H01L 21/8239 |
| 2019/0355401 A1* | 11/2019 | Shiokawa | G11C 11/161 |
| 2019/0378974 A1* | 12/2019 | Sasaki | G01R 33/098 |

* cited by examiner

MAGNETORESISTANCE EFFECT ELEMENT, MAGNETIC MEMORY, AND MAGNETIC DEVICE

BACKGROUND OF THE INVENTION

Field of the Invention

The present invention relates to a magnetoresistance effect element, a magnetic memory, and a magnetic device.

Priority is claimed on Japanese Patent Application Nos. 2017-169734 and 2018-158487, filed Sep. 4, 2017 and Aug. 27, 2018, the content of which is incorporated herein by reference.

Description of Related Art

A giant magnetoresistance (GMR) element formed of a multilayer film such as a ferromagnetic layer and a non-magnetic layer and a tunneling magnetoresistance (TMR) element using an insulating layer (tunnel barrier layer or barrier layer) as a non-magnetic layer are known. Generally, a TMR element has an electrical resistance higher than that of a GMR element and a magnetoresistance (MR) ratio thereof is larger than that of a GMR element. For this reason, TMR elements are attracting attention as elements for magnetic sensors, high frequency components, magnetic heads, and nonvolatile random access memories (MRAMs).

These magnetoresistance effect elements have a structure in which a non-magnetic layer is sandwiched between two ferromagnetic layers having different coercivities and it is possible to read and write data using characteristics in which electrical resistance varies in accordance with an angle formed by a magnetization direction of one of the ferromagnetic layers and a magnetization direction of the other of the ferromagnetic layers. As a writing method of an MRAM, a method of performing writing using a magnetic field generated through a current (performing magnetization reversal) and a method of performing writing using a spin transfer torque (STT) generated when a current is caused to flow in a lamination direction of a magnetoresistance effect element (performing magnetization reversal) are known.

Recent devices such as MRAMs (STT-MRAMs) using an STT are configured so that a current with a high current density flows through a magnetoresistance effect element to perform writing at a high speed. For this reason, in a magnetoresistance effect element at the time of writing, heat is generated due to a current. Heat generation facilitates magnetization reversal of a ferromagnetic layer, whereas a failure occurs due to deterioration of a non-magnetic layer and the melting of a wiring layer formed of a low melting point metal and characteristic deteriorations such as instability in the magnetization of a fixed layer are caused.

Patent Document 1 describes a constitution in which boron nitride known as an element having excellent heat dissipation properties is used for a sidewall of a magnetoresistance effect element. However, this sidewall includes boron nitride as a main component, does not have sufficient insulation properties, and is not easily manufactured by applying a general semiconductor process. Furthermore, boron nitride synthesized at a low temperature or through a vapor phase method is likely to have a disordered laminated structure and boron nitride is grain-grown. Thus, gaps are generated between grains of boron nitride and thus the sidewall containing boron nitride does not have sufficient insulation properties. Furthermore, in order to manufacture dense boron nitride, a method of causing boron trichloride (BCl3) and ammonia to react with each other at a high temperature is known, but this reaction causes the magnetic characteristics of a magnetoresistance effect element to deteriorate. Particularly, in a TMR element, when a non-magnetic tunnel barrier layer which generates a tunnel current is chemically influenced, there is a problem of significant deterioration of output characteristics.

Patent Document

[Patent Document 1] Japanese Unexamined Patent Application, First Publication No. 2012-38815

SUMMARY OF THE INVENTION

The present invention was made in view of the above circumstances and an objective of the present invention is to provide a magnetoresistance effect element, a magnetic memory, and a magnetic device having structures which are easily manufactured, which have sufficient electrical characteristics as a magnetoresistance effect element, and in which characteristic deterioration caused by heat generation is less likely to occur.

DETAILED DESCRIPTION OF THE INVENTION

The present invention will be described in detail below by appropriately referring to the drawing. In the drawings used in the following description, enlarged characteristic portions are illustrated in some cases for the sake of convenience so that the characteristics of the present invention can be easily understood and thus dimensional proportions and the like of respective constituent elements may be different from the actual sizes in some cases. Materials and dimensions exemplified in the following description are merely examples and the present invention is not limited thereto. Modifications within the range in which the effects of the present invention can be achieved are also possible. In elements of this disclosure, other layers may be provided as long as the effects of this disclosure are achieved.

First Embodiment (Constitution of Magnetoresistance Effect Element)

Figure 1:
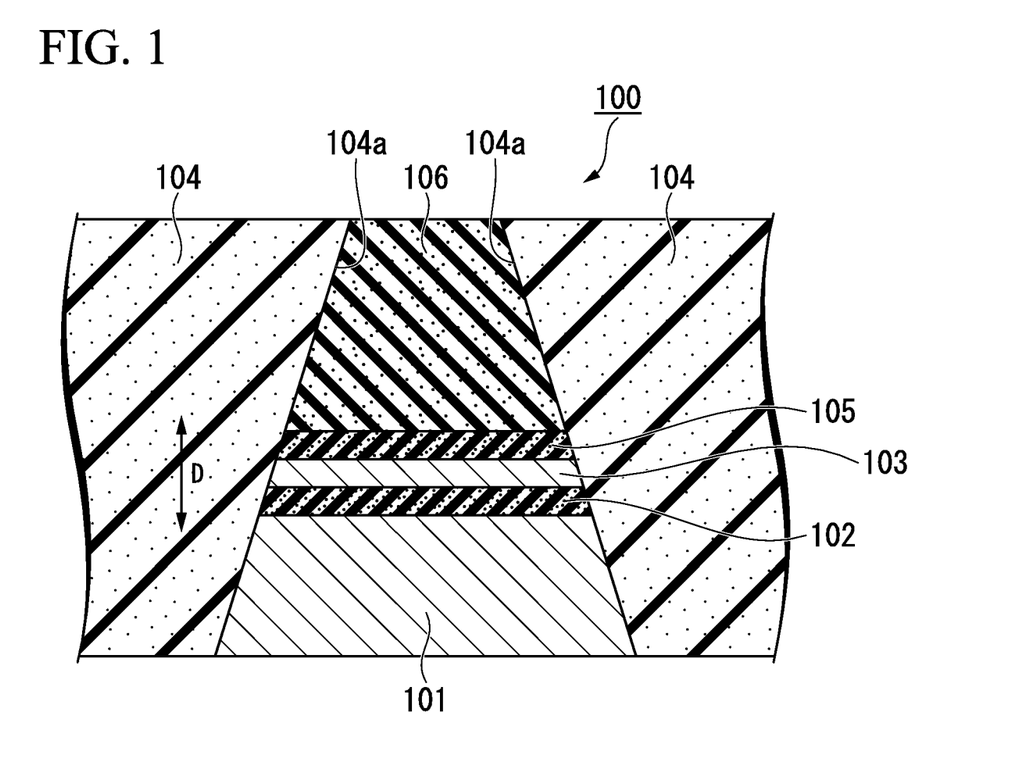
FIG. 1 is a cross-sectional view schematically showing a constitution of a magnetoresistance effect element according to a first embodiment of the present invention.

FIG. 1 is a cross-sectional view schematically showing a constitution of a magnetoresistance effect element 100 according to a first embodiment of this disclosure. The magnetoresistance effect element 100 has a structure in which a first ferromagnetic layer 101, a non-magnetic layer 102, and a second ferromagnetic layer 103 are sequentially laminated. Description will be provided below using the first ferromagnetic layer 101 as a fixed layer whose magnetization direction is fixed and using the second ferromagnetic layer 103 as a free layer whose magnetization direction can be changed.

The first ferromagnetic metal layer 101 and the second ferromagnetic metal layer 103 are made of a known material having ferromagnetic properties (preferably, a soft magnetic material), for example, a metal selected from the group consisting of Cr, Mn, Co, Fe, and Ni, a ferromagnetic alloy which contains at least one of these metals, and the like. Furthermore, the first ferromagnetic metal layer 101 and the second ferromagnetic metal layer 103 are made of an alloy (specifically, Co—Fe and Co—Fe—B) and the like which contains at least one of these metals and at least one of the elements B, C, and N in some cases.

Also, in order to obtain a higher output, it is desirable to use a Heusler alloy such as $Co_2FeSi$. A Heusler alloy contains an intermetallic compound having a chemical composition represented by $X_2YZ$. Here, X is a transition metal element or a noble metal element from the Co, Fe, Ni, or Cu groups in the periodic table, Y is a transition metal from the Mn, V, Cr, or Ti groups or an element of the X type, and Z is a typical element from Group III to Group V. For example, $Co_2FeSi$, $Co_2MnSi$, $Co_2Mn_{1-a}Fe_aAl_bSi_{1-b}$, and the like may be exemplified as a Heusler alloy.

By selecting a material having a coercivity higher than that of a material of the second ferromagnetic metal layer 103 as a material of the first ferromagnetic metal layer 101, it is more difficult to reverse magnetization of the first ferromagnetic metal layer 101 as compared with the second ferromagnetic metal layer 103. In this case, it is possible to handle the first ferromagnetic metal layer 101 as a magnetization fixed layer and the second ferromagnetic metal layer 103 as a magnetization free layer.

When a material having the same coercivity as a material of the second ferromagnetic metal layer 103 is selected as a material of the first ferromagnetic metal layer 101, a pinning layer is provided on a surface or an inside of the first ferromagnetic metal layer 101 and fixes magnetization of the first ferromagnetic metal layer 101. Examples of the pinning layer include a layer made of an antiferromagnetic material such as IrMn and PtMn. The magnetization of the first ferromagnetic metal layer 101 is more firmly fixed through exchange coupling with magnetization of an antiferromagnetic layer. Thus, also in this case, it is more difficult to reverse the magnetization of the first ferromagnetic metal layer 101 as compared with the second ferromagnetic metal layer 103.

Also, the first ferromagnetic metal layer 101 is preferably a lamination film containing Co and Pt when a magnetization direction thereof is perpendicular to a lamination surface thereof. Examples of a specific layer constitution include [Co (0.24 nm)/Pt (0.16 nm)]6/Ru (0.9 nm)/[Pt (0.16 nm)/Co (0.16 nm)]4/Ta (0.2 nm)/FeB (1.0 nm). Numerical values in parentheses indicate film thicknesses.

The first ferromagnetic metal layer 101 and the second ferromagnetic metal layer 103 may be in-plane magnetization films whose magnetization directions are parallel to surfaces of layers and perpendicular magnetization films whose magnetization directions are perpendicular to surfaces of layers.

A known material can be used for the non-magnetic layer 102. For example, when the non-magnetic layer 102 is made of an insulator, examples of a material thereof include $Al_2O_3$, $SiO_2$, $MgO$, $MgAl_2O_4$, and the like. Furthermore, in addition to these, materials and the like obtained by substituting part of Al, Si, and Mg with Zn, Be, or the like can be used. Among them, $MgO$ and $MgAl_2O_4$ are materials capable of realizing coherent tunneling. Thus, it is possible to efficiently inject spins. Furthermore, when the non-magnetic layer 102 is made of a metal, examples of a material thereof include Cu, Au, Ag, and the like.

The magnetoresistance effect element 100 corresponds to a tunneling magnetoresistance (TMR) element when the non-magnetic layer 102 is made of an insulator and corresponds to a giant magnetoresistance (GMR) element when the non-magnetic layer 102 is made of a metal.

Outer circumferential portions of the first ferromagnetic layer 101, the non-magnetic layer 102, and the second ferromagnetic layer 103 (lateral surfaces in a direction which intersects a lamination direction) are covered with a first insulating film 104 which contains silicon nitride as a main component and further contains further boron nitride or aluminum nitride. The first insulating film 104 is a film forming a lateral wall portion of the magnetoresistance effect element. The area content of boron nitride or aluminum nitride in the first insulating film 104 is preferably 3% or more and 30% or less. When the area content of boron nitride or aluminum nitride increases, insulating characteristics deteriorate and the first insulating film 104 does not function as an outer circumferential portion of the first ferromagnetic layer 101, the non-magnetic layer 102, and the second ferromagnetic layer 103. Therefore, it is necessary to maintain sufficient insulating characteristics by mainly bringing a portion around a grain of boron nitride or aluminum nitride into contact with silicon nitride. Furthermore, the volume content of boron nitride or aluminum nitride in the first insulating film 104 can be obtained by mapping a cross section of the magnetoresistance effect element through energy dispersive X-ray analysis (EDS) and using an area ratio between a portion including boron and a portion including silicon in the first insulating film 104.

The first insulating film 104 can also be formed, for example, by simultaneously sputtering silicon nitride and boron nitride through an ion beam method.

In the formed first insulating film 104, boron nitride forms a plurality of grains having a grain size of about 0.5 to 10 nm distributed (scattered) substantially uniformly in a film made of silicon nitride which is a main component in a direction which is substantially parallel to an interface 104a between the first ferromagnetic layer 101, the non-magnetic layer 102, and the second ferromagnetic layer 103. Boron nitride may be distributed at least near the interface 104a (in a range of about 5 nm) and may be distributed so that a concentration of grains continuously or intermittently decreases moving away from the interface 104a in a direction which is substantially perpendicular to the interface 104a of the first insulating film. This is due to the following reasons. In the magnetoresistance effect element, a non-magnetic layer which is a tunnel barrier mainly generates heat, thereby causing heat conduction in the first ferromagnetic layer 101 and the second ferromagnetic layer 103 in contact with the non-magnetic layer. Heat conduction is further generated in a metal layer in contact with the first ferromagnetic layer 101 and the second ferromagnetic layer 103, but heat conduction is also generated in the first insulating film 104. Particularly, when a size of the magnetoresistance effect element is sufficiently small, an influence of the first insulating film 104 increases. Thus, it is desirable that heat conduction in the vicinity of the interface 104a be large. When heat conduction is generated in the vicinity of the interface 104a, an effective size of the magnetoresistance effect element increases. Thus, even when a distribution of a concentration of grains continuously or intermittently decreases, a sufficient heat dissipation function is provided.

When the first insulating film 104 contains granular boron nitride or aluminum nitride, a degree of adhesion of the first insulating film 104 to the first ferromagnetic layer 101, the non-magnetic layer 102, and the second ferromagnetic layer 103 can increase and generation of film-peeling-off can be prevented. This is because, since boron nitride or aluminum nitride has a low coefficient of thermal expansion, even when a temperature difference is generated between the first insulating film 104 and a metal portion of the magnetoresistance effect element, the adhesion does not significantly vary.

It is desirable that a cap layer 105 which contains an oxide, for example, MgO or $AB_2O_4$ having a spinel structure (A is any one of Ma and Zn and B is any one of Al, Ga, and In) be provided on a portion in a surface of the second ferromagnetic layer 103 opposite to the non-magnetic layer 102 (above the second ferromagnetic layer 103 in FIG. 1).

When the second ferromagnetic layer 103 is a perpendicular magnetization film, a magnetic element in the second ferromagnetic layer 103 and oxygen atoms in the non-magnetic layer 102 bind together at the interface between the second ferromagnetic layer 103 and the non-magnetic layer 102 to generate perpendicular magnetization. When the cap layer 105 is provided, even when a magnetic element in the second ferromagnetic layer 103 and oxygen atoms in the cap layer 105 further bind together at the interface between the second ferromagnetic layer 103 and the cap layer 105, perpendicular magnetization is generated. That is to say, the cap layer 105 plays a role of reinforcing magnetization in a perpendicular direction (lamination direction) D of the second ferromagnetic layer 103.

The oxide in the cap layer 105 is likely to be in a state in which there is a deficiency of oxygen atoms through an annealing treatment. Thus, when a film surrounding the cap layer 105 contains oxygen atoms to compensate for oxygen atoms of the defective portion, the cap layer 105 tends to take oxygen atoms from this film. As a result, the electrical conductivity of the surrounding film from which oxygen atoms are taken away increases and thus electrical characteristics thereof deviate from those of a designed value.

In order to solve the above-described problems, it is desirable that the film around the cap layer 105 be formed of a film having a nitride as a main component as in the first insulating film 104. This film may be connected to or separated from the first insulating film 104, but in view of simplifying a production process and in view of maximizing a covering area, it is desirable to be connected thereto.

Also, a mask layer 106 made of a heavy metal element such as Ta or an element with high hardness such as TiN and TaN may be provided on a portion in a surface of the cap layer 105 opposite to the second ferromagnetic layer 103 (above the cap layer 105 in FIG. 1). The mask layer 106 plays a role of protecting the remaining portion as the magnetoresistance effect element at the time of etching.

The mask layer 106 is formed of a heavy metal element. Thus, unlike a resist which is easily scraped, it is not necessary to consider excessive scraping and thus it is possible to form a thinner layer. Therefore, even when the magnetoresistance effect element is manufactured to have a high degree of integration, it is possible to eliminate an influence of a shadow effect due to the mask layer at the time of etching. It should be noted that, when a degree of integration of the magnetoresistance effect element does not increase, a resist may be used for the mask layer.

Like the first insulating film 104, the mask layer 106 made of a heavy metal element easily absorbs boron. For this reason, for example, when the first ferromagnetic layer 101 and the second ferromagnetic layer 103 contain boron, it is possible to prevent diffusion of boron to other portions by guiding boron to the mask layer 106.

(Method of Manufacturing Magnetoresistance Effect Element)

An example of a method of manufacturing the magnetoresistance effect element 100 will be described with reference to FIGS. 2A to 2C.

Figure 2A:
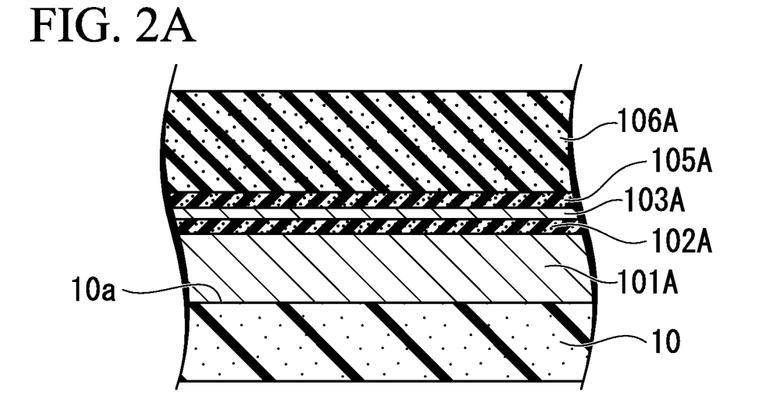
FIGS. 2A to 2C are cross-sectional views of an object to be processed in a manufacturing process of the magnetoresistance effect element according to the first embodiment of the present invention.

First, as illustrated in FIG. 2A, films 101A, 102A, 103A, 105A, and 106A formed as the first ferromagnetic layer, the non-magnetic layer, the second ferromagnetic layer, the cap layer, and the mask layer, respectively, are sequentially formed on one surface 10a of a base member 10 serving as a supporting body using a known film forming method such as a physical vapor deposition (PVD) method and a chemical vapor deposition (CVD) method. Examples of the physical vapor deposition method include a resistance heating vapor deposition method, an electron beam vapor deposition method, a molecular beam epitaxy (MBE) method, an ion plating method, an ion beam deposition method, a sputtering method, and the like. Examples of the chemical vapor deposition method include a thermal CVD method, a photo CVD method, a plasma CVD method, a metal organic chemical vapor deposition (MOCVD) method, an atomic layer deposition (ALD) method, and the like.

When a functional unit constituted of the first ferromagnetic layer, the non-magnetic layer, and the second ferromagnetic layer is a TMR element, the non-magnetic layer is a tunnel barrier layer. The tunnel barrier layer is formed, for example, through the following procedure. First, a metal thin film made of magnesium, aluminum, and divalent cations of a plurality of non-magnetic elements of about 0.4 to 2.0 nm is first formed by performing sputtering above the first ferromagnetic layer. Subsequently, a tunnel barrier layer is obtained by performing plasma oxidation or natural oxidation through oxygen introduction and then performing heat treatment.

Since a layer formed through reactive sputtering is amorphous and needs to be crystallized, it is desirable to perform an annealing treatment on the obtained functional unit.

A functional unit obtained through annealing treatment has a magnetoresistance ratio which improves as compared with a functional unit obtained without annealing treatment. It is conceivable that this is because the uniformity and the orientation of a crystal size of the non-magnetic layer (tunnel barrier layer) are improved through annealing treatment.

As the annealing treatment, it is desirable that heating be performed for 5 minutes or more and 100 minutes or less in a temperature range of 300° C. or more and 500° C. or less in an inert atmosphere such as Ar and then heating be performed for 1 hour or more and 10 hours or less at a temperature of 100° C. or more and 500° C. or less in a state in which a magnetic field of 2 kOe or more and 10 kOe or less is applied.

Figure 2B:
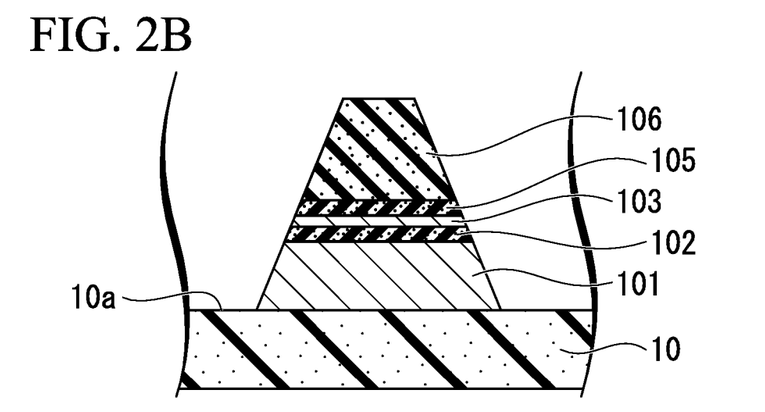

Subsequently, as illustrated in FIG. 2B, the five formed films 101A, 102A, 103A, 105A, and 106A are processed to have desired shapes by removing unnecessary portions using a photolithography method, an ion milling method, a reactive ion etching (RIE) method, or the like. It is desirable that tapers of cross sections of the layers 101, 102, 103, 105, and 106 formed through the process be formed to be as small as possible.

Figure 2C:
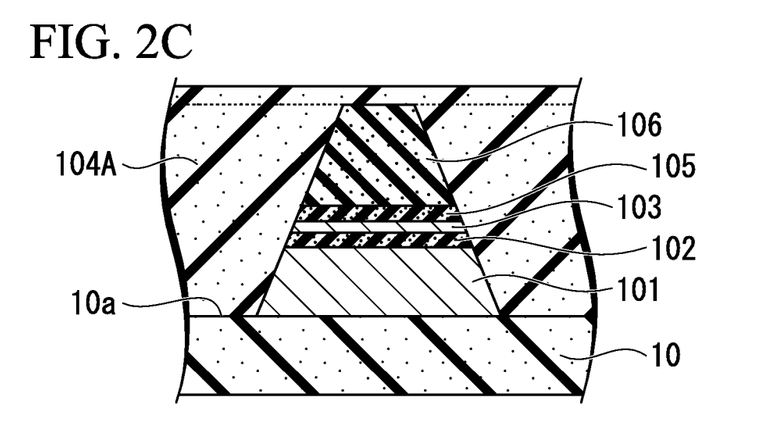

Subsequently, as illustrated in FIG. 2C, a silicon nitride film 104A is formed to cover exposed portions in the one surface 10a of the base member, the first ferromagnetic layer 101, the non-magnetic layer 102, the second ferromagnetic layer 103, the cap layer 105, and the mask layer 106 using a CVD method.

Also, an outermost surface of the formed silicon nitride film is planarized through CMP treatment. This CMP treatment may be performed until the mask layer 106 is exposed from an outermost surface of the silicon nitride film is exposed (to a position of a broken line in FIG. 2), but the silicon nitride film may remain above the mask layer 106.

Subsequently, the first insulating film in this embodiment can be formed by implanting boron nitride or aluminum nitride into the silicon nitride film 104A using an ion beam method. In this case, it is desirable that annealing treatment is continuously performed to repair damage due to the implantation of boron nitride or aluminum nitride. It should be noted that the first insulating film can also be formed by sputtering silicon nitride and boron nitride or aluminum nitride at the same time instead of performing CVD treatment on exposed portions of the one surface 10a of the base member, the first ferromagnetic layer 101, the non-magnetic layer 102, the second ferromagnetic layer 103, the cap layer 105, and the mask layer 106.

It is possible to obtain the magnetoresistance effect element 100 in this embodiment through the above-described steps. It should be noted that the base member 10 used as a supporting body may be removed in accordance with the use of the magnetoresistance effect element 100.

Figure 3:
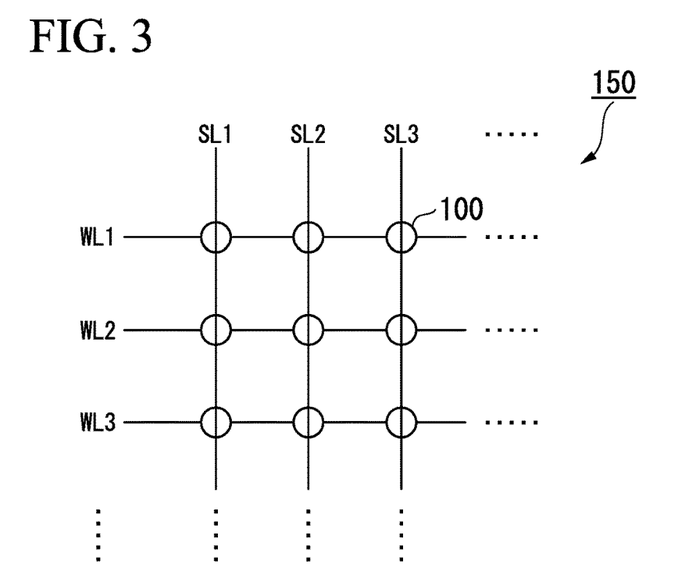
FIG. 3 is a plan view schematically showing a constitution of a magnetic memory according to the first embodiment of the present invention.

The magnetoresistance effect element 100 can operate as a magnetic memory from and to which data is read and written using characteristics in which an element resistance varies in accordance with an angle formed by the magnetization direction of the first ferromagnetic layer 101 and the magnetization direction of the second ferromagnetic layer 103. As illustrated in FIG. 3, in a magnetic memory 150, one wiring layers of each magnetoresistance effect element 100 are joined together through source lines (bit lines) SL1, SL2, SL3, . . . and the other wiring layers thereof are joined together through word lines WL1, WL2, WL3, . . . . By installing a plurality of such magnetic memories as built-in memories on an LSI substrate, it is possible to obtain a magnetic device in which an influence of a delay proportional to a distance between the magnetoresistance effect elements 100 is reduced.

As described above, in the magnetoresistance effect element 100 according to this embodiment, outer circumferential portions of the first ferromagnetic layer 101, the non-magnetic layer 102, and the second ferromagnetic layer 103 contain silicon nitride as a main component and have boron nitride or aluminum nitride further added thereto. Thus, the outer circumferential portions are covered with the first insulating film 104 having excellent insulation properties and heat dissipation properties. For this reason, even when a large current flows through the first ferromagnetic layer 101, the non-magnetic layer 102, and the second ferromagnetic layer 103, it is possible to prevent current leakage from the outer circumferential portions and to efficiently dissipate heat generated along with a current from the outer circumferential portions. Since the first insulating film 104 is a film containing silicon nitride as a main component, it is possible to manufacture the first insulating film 104 by applying a general semiconductor process. Therefore, according to the magnetoresistance effect element 100 associated with this embodiment, it is possible to obtain a magnetoresistance effect element, a magnetic memory, and a magnetic device which have a structure which is easily manufactured, which has sufficient electric characteristics as a magnetoresistance effect element, and in which an element failure due to heat generation does not easily occur.

Modified Example 1

Figure 4:
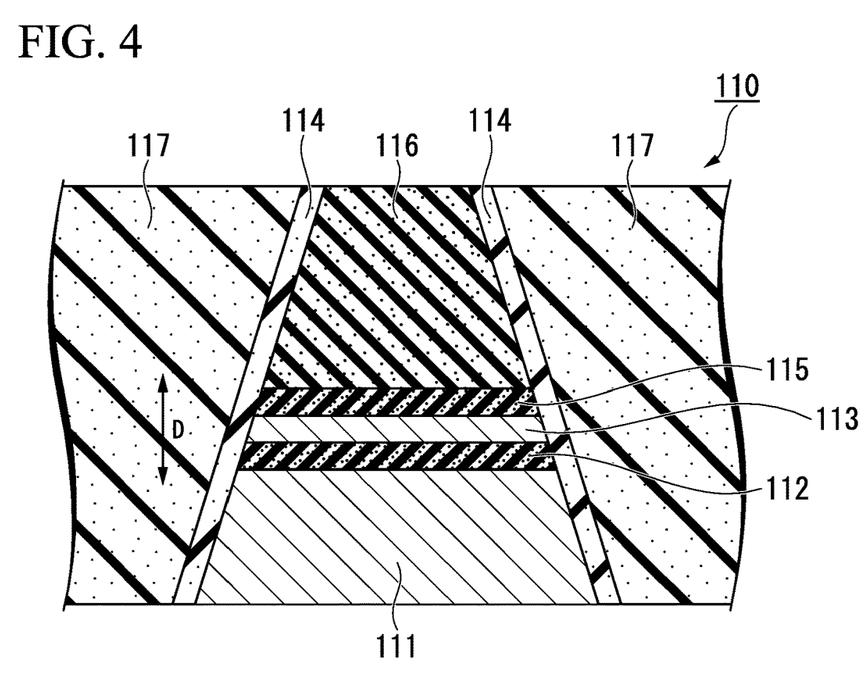
FIG. 4 is a cross-sectional view schematically showing a constitution of a magnetoresistance effect element according to Modified Example 1 of the first embodiment of the present invention.

FIG. 4 is a cross-sectional view schematically showing a constitution of a magnetoresistance effect element 110 according to Modified Example 1 of this embodiment. In the magnetoresistance effect element 110, a surface portion of the first insulating film 114 opposite to a non-magnetic layer 112 is covered with a second insulating film 117 containing an oxide, a nitride, or an oxynitride. An oxide, nitride, or oxynitride film can be manufactured relatively easily by applying a general semiconductor process. In this case, since the first insulating film 114 narrows by an extent that the second insulating film 117 is formed, it is possible to reduce a size of an injection region of boron nitride or aluminum nitride. Therefore, it is possible to reduce a time and costs required for the injection of boron nitride or aluminum nitride. A constitution other than the second insulating film 117 is the same as the constitution of the magnetoresistance effect element 100 according to the first embodiment and has the same effects as those of the magnetoresistance effect element 100.

Modified Example 2

Figure 5:
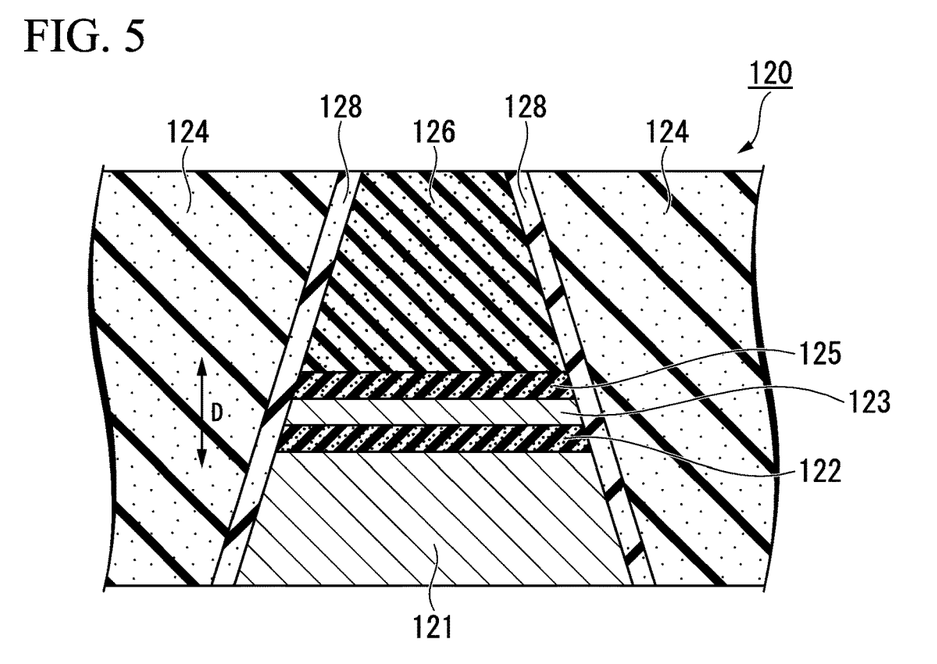
FIG. 5 is a cross-sectional view schematically showing a constitution of a magnetoresistance effect element according to Modified Example 2 of the first embodiment of the present invention.

FIG. 5 is a cross-sectional view schematically showing a constitution of a magnetoresistance effect element 120 according to Modified Example 2 of this embodiment. In the magnetoresistance effect element 120, a third insulating film 128 containing an oxide, a nitride, or an oxynitride is provided between a non-magnetic layer 122 and a first insulating film 124. As illustrated in FIG. 5, the third insulating film 128 may be formed not only between the first insulating film 124 and the non-magnetic layer 122, but also between the first insulating film 124 and other layers 121, 123, 125, and 126.

In this case, since the third insulating film 128 functions as a heat sink and absorbs heat generated inside a magnetoresistance element, it is possible to reduce damage caused by heat generated by layers formed as functional units such as a first ferromagnetic layer, a non-magnetic layer, and a second ferromagnetic layer. A constitution other than the third insulating film 128 is the same as the constitution of the magnetoresistance effect element 100 according to the first embodiment and has the same effects as those of the magnetoresistance effect element 100.

Modified Example 3

Figure 6:
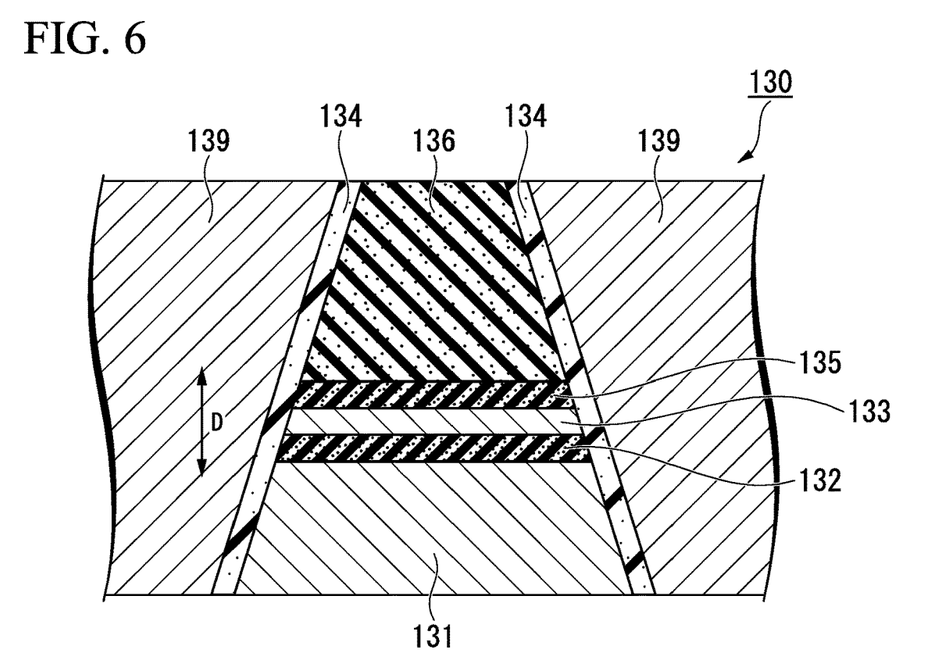
FIG. 6 is a cross-sectional view schematically showing a constitution of a magnetoresistance effect element according to Modified Example 3 of the first embodiment of the present invention.

FIG. 6 is a cross-sectional view schematically showing a constitution of a magnetoresistance effect element 130 according to Modified Example 3 of this embodiment. In the magnetoresistance effect element 130, a surface portion of the first insulating film 134 opposite to a non-magnetic layer 132 is covered with a metal film (ferromagnetic metal film)

139 containing a metal element (ferromagnetic metal). Thus, the magnetoresistance effect element 130 has better heat dissipation properties than those when the magnetoresistance effect element 130 has the entire sidewall formed of an insulating film having silicon nitride as a main component and has a structure in which characteristic deterioration due to heat generation is less likely to occur. In the constitution of Modified Example 3, in order to maintain excellent insulation properties, it is desirable that a distance between the non-magnetic layer 132 and the metal film 139 (that is, a thickness of the first insulating film 134) be about 30 nm or more. A constitution other than the metal film 139 is the same as the constitution of the magnetoresistance effect element 100 according to the first embodiment and has the same effects as the magnetoresistance effect element 100.

Second Embodiment

In the magnetoresistance effect element 100 according to the first embodiment, the outer circumferential portions of the first ferromagnetic layer 101, the non-magnetic layer 102, and the second ferromagnetic layer 103 are covered with the first insulating film 104 which contains silicon nitride as a main component and contains further boron nitride or aluminum nitride. On the other hand, in the magnetoresistance effect element according to the second embodiment, the outer circumferential portions of the first ferromagnetic layer, the non-magnetic layer, and the second ferromagnetic layer are covered with a fifth insulating film which contains silicon nitride as a main component and contains further diamond-like carbon (DLC). It is desirable that the area content of diamond-like carbon (DLC) with respect to boron nitride in the fifth insulating film be 3% or more and 30% or less. A constitution other than the fifth insulating film is the same as the constitution of the magnetoresistance effect element 100 in the first embodiment and has the same effects as the magnetoresistance effect element 100.

The fifth insulating film can also be formed, for example, by sputtering silicon nitride and diamond-like carbon at the same time.

In the magnetoresistance effect element according to this embodiment, the outer circumferential portions of the first ferromagnetic layer, the non-magnetic layer, and the second ferromagnetic layer are covered with the fifth insulating film having excellent insulation properties and heat dissipation properties due to silicon nitride contained as a main component and diamond-like carbon further added thereto. For this reason, even when a large current flows through the first ferromagnetic layer, the non-magnetic layer, and the second ferromagnetic layer, it is possible to prevent current leakage from the outer circumferential portions and to efficiently dissipate heat generated along with a current from the outer circumferential portions. Since the fifth insulating film is a film containing silicon nitride as a main component, it is possible to manufacture the fifth insulating film by applying a general semiconductor process. Therefore, according to the magnetoresistance effect element in this embodiment, it is possible to obtain a magnetoresistance effect element, a magnetic memory, and a magnetic device which have a structure which is easily manufactured, which has sufficient electrical characteristics for a magnetoresistance effect element, and in which characteristic deterioration caused by heat generation is less likely to occur.

While the preferred embodiments of the present invention have been described above, the present invention is not limited to these embodiments. Additions, omissions, and substitutions of the constitution and modifications thereof are possible without departing from the gist of the present invention. The present invention is not limited by the above description and is limited only by the scope of the appended claims.

EXPLANATION OF REFERENCES 100, 110, 120, 130 Magnetoresistance effect element
101, 111, 121, 131 First ferromagnetic layer
102, 112, 122, 132 Non-magnetic layer
103, 113, 123, 133 Second ferromagnetic layer
104, 114, 124, 134 First insulating film
104a Interface
105, 115, 125, 135 Cap layer
106, 116, 126, 136 Mask layer
117 Second insulating film
128 Third insulating film
139 Metal film
150 Magnetic memory
10 Base member
10a One surface of base member
D Lamination direction

What is claimed is:

1. A magnetoresistance effect element comprising:
   a structure in which a first ferromagnetic layer; a non-magnetic layer; and a second ferromagnetic layer are sequentially laminated,
   wherein:
   outer circumferential portions of the first ferromagnetic layer, the non-magnetic layer, and the second ferromagnetic layer are covered with a first insulating film which contains silicon nitride as a main component and contains further boron nitride or aluminum nitride, and
   a surface portion of the first insulating film opposite to the non-magnetic layer is covered with a second insulating film containing an oxide, a nitride, or an oxynitride.

2. The magnetoresistance effect element according to claim 1,
   wherein at least one layer of the first ferromagnetic layer and the second ferromagnetic layer contains boron.

3. The magnetoresistance effect element according to claim 1,
   wherein the boron nitride or the aluminum nitride forms grains and a plurality of grains are distributed inside the first insulating film.

4. The magnetoresistance effect element according to claim 1,
   wherein a third insulating film containing an oxide, a nitride, or an oxynitride is provided between the non-magnetic layer and the first insulating film.

5. The magnetoresistance effect element according to claim 1,
   wherein a metal film containing a metal element is provided in a portion of the surface of the first insulating film opposite to the non-magnetic layer.

6. A magnetoresistance effect element comprising:
   a structure in which a first ferromagnetic layer; a non-magnetic layer; and a second ferromagnetic layer are sequentially laminated,
   wherein:
   outer circumferential portions of the first ferromagnetic layer, the non-magnetic layer, and the second ferromagnetic layer are covered with a fifth insulating film which contains silicon nitride as a main component and contains further diamond-like carbon, and a cap layer is provided on the portion of the surface of the second ferromagnetic layer opposite to the non-magnetic layer, the cap layer containing MgO or $AB_2O_4$ having a spinel structure, where A represents Mg or Zn, and B represents Al, Ga, or In.

7. A magnetic memory comprising:
the magnetoresistance effect element according to claim 1.

8. A magnetic device comprising:
the magnetic memory according to claim 7 installed in an LSI substrate as a built-in memory.

9. The magnetoresistance effect element according to claim 2,
wherein the boron nitride or the aluminum nitride forms grains and a plurality of grains are distributed inside the first insulating film.

10. The magnetoresistance effect element according to claim 2,
wherein a third insulating film containing an oxide, a nitride, or an oxynitride is provided between the non-magnetic layer and the first insulating film.

11. The magnetoresistance effect element according to claim 3,
wherein a third insulating film containing an oxide, a nitride, or an oxynitride is provided between the non-magnetic layer and the first insulating film.

12. The magnetoresistance effect element according to claim 2,
wherein a metal film containing a metal element is provided in a portion of the surface of the first insulating film opposite to the non-magnetic layer.

13. The magnetoresistance effect element according to claim 3,
wherein a metal film containing a metal element is provided in a portion of the surface of the first insulating film opposite to the non-magnetic layer.

14. The magnetoresistance effect element according to claim 4,
wherein a metal film containing a metal element is provided in a portion of the surface of the first insulating film opposite to the non-magnetic layer.

* * * * *